United States Patent
Vankayala et al.

(10) Patent No.: US 12,362,013 B2
(45) Date of Patent: *Jul. 15, 2025

(54) PRE-DECODER CIRCUITRY

(71) Applicant: Micron Technology, Inc., Boise, ID (US)

(72) Inventors: Vijayakrishna J. Vankayala, Allen, TX (US); Hari Giduturi, Folsom, CA (US); Jeffrey E. Koelling, Fairview, TX (US); Mingdong Cui, Folsom, CA (US); Ramachandra Rao Jogu, Mckinney, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/639,690

(22) Filed: Apr. 18, 2024

(65) Prior Publication Data

US 2024/0265965 A1 Aug. 8, 2024

Related U.S. Application Data

(63) Continuation of application No. 17/831,311, filed on Jun. 2, 2022, now Pat. No. 11,967,373.

(51) Int. Cl.
*G11C 13/00* (2006.01)
*H03K 19/20* (2006.01)

(52) U.S. Cl.
CPC ...... *G11C 13/0023* (2013.01); *G11C 13/0004* (2013.01); *G11C 2213/15* (2013.01); *H03K 19/20* (2013.01)

(58) Field of Classification Search
CPC ............ G11C 13/0023; G11C 13/0004; G11C 2213/15; G11C 8/10; G11C 16/08; G11C 2213/73; H03K 19/20
USPC ..................................... 365/230.06
See application file for complete search history.

(56) References Cited

U.S. PATENT DOCUMENTS

| | | |
|---|---|---|
| 7,123,500 B2 | 10/2006 | Ye et al. |
| 10,553,575 B2 | 2/2020 | Tien et al. |
| 11,967,373 B2 * | 4/2024 | Vankayala ............. G11C 16/08 |
| 2007/0076512 A1 | 4/2007 | Castro |
| 2021/0391328 A1 | 12/2021 | Sio et al. |

* cited by examiner

*Primary Examiner* — Huan Hoang
(74) *Attorney, Agent, or Firm* — Brooks, Cameron & Huebsch, PLLC

(57) ABSTRACT

The present disclosure includes apparatuses, methods, and systems for pre-decoder circuitry. An embodiment includes a memory array including a plurality of memory cells, decoder circuitry coupled to the memory array, wherein the decoder circuitry comprises a p-type transistor having a first gate, a first n-type transistor having a second gate, and a second n-type transistor having a third gate, and pre-decoder circuitry configured to provide a bias condition for the first gate, the second gate, and the third gate to provide a selection signal to one of the plurality of memory cells, wherein the bias condition comprises zero volts for the first gate, the second gate, and the third gate for a positive configuration for the memory cells and a negative voltage for the third gate and zero volts for the first gate and the second gate for a negative configuration for the memory cells.

20 Claims, 5 Drawing Sheets

PRE-DECODER CIRCUITRY

PRIORITY INFORMATION

This Application is a Continuation of U.S. application Ser. No. 17/831,311, filed on Jun. 2, 2022, the contents of which are incorporated herein by reference.

TECHNICAL FIELD

The present disclosure relates generally to semiconductor memory and methods, and more particularly, to pre-decoder circuitry.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
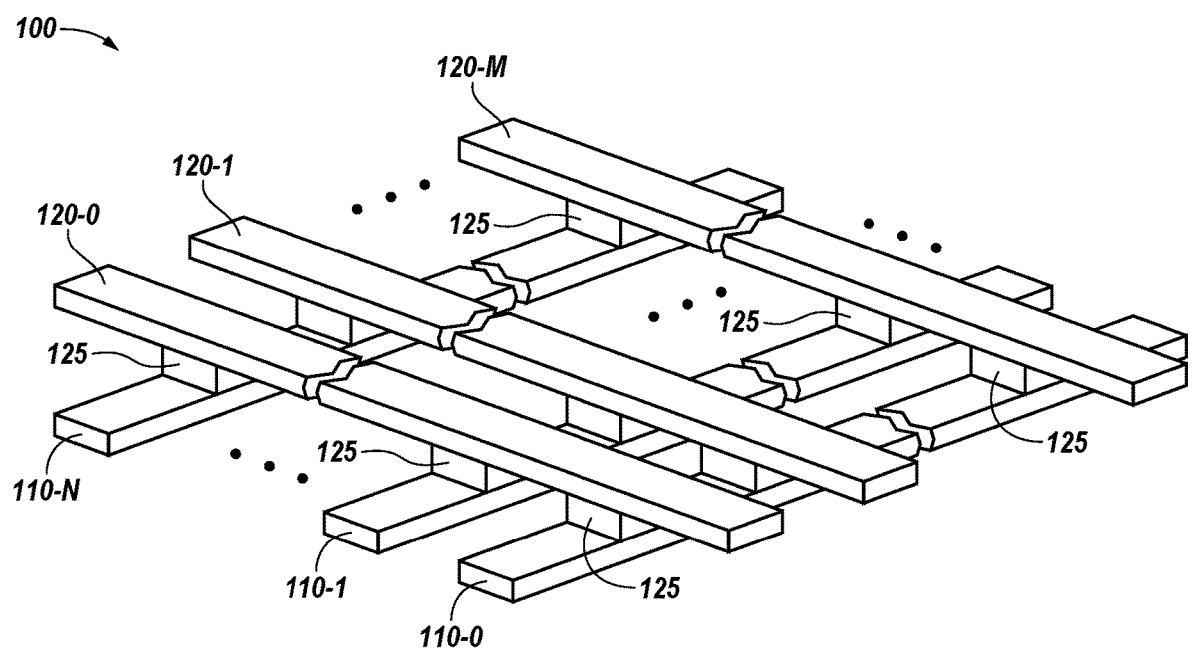
FIG. 1 is a three-dimensional view of an example of a memory array, in accordance with an embodiment of the present disclosure.

The present disclosure includes apparatuses, methods, and systems for pre-decoder circuitry. An example apparatus includes a memory array including a plurality of memory cells, decoder circuitry coupled to the memory array, wherein the decoder circuitry comprises a p-type transistor having a first gate, a first n-type transistor having a second gate, and a second n-type transistor having a third gate, and pre-decoder circuitry configured to provide a bias condition for the first gate, the second gate, and the third gate to provide a selection signal to one of the plurality of memory cells, wherein the bias condition comprises zero volts for the first gate, the second gate, and the third gate for a positive configuration for the memory cells and a negative voltage for the third gate and zero volts for the first gate and the second gate for a negative configuration for the memory cells.

Previous memory apparatuses have utilized decoder circuitry including one p-type transistor and one n-type transistor (1P1N bi-polar decoders) to provide selection and de-selection signals for programming and sensing memory cells (e.g., resistance variable memory cells). These 1P1N bi-polar decoders may have eight configuration modes: four positive configuration modes, where one positive configuration mode corresponds to a selection signal and three positive configuration modes correspond to de-selection signals; and four negative configuration modes, where one negative configuration mode corresponds to a selection signal and three negative configuration modes correspond to de-selection signals. These 1P1N bi-polar decoders exhibit significant power consumption because the gate biases of each of the unselected 1P1N bi-polar decoders (e.g., corresponding to the de-selection signals) changes during polarity transitions.

Embodiments of the present disclosure, however, may utilize decoder circuitry including one p-type transistor and two n-type transistors (1P2N bi-polar decoders) to provide such selection and de-selection signals, which can provide reduced power consumption, as compared to previous apparatuses that utilize 1P1N bi-polar decoders. One n-type transistor is used for the negative voltage on the signal line (e.g., the bit line or word line) when in the negative polarity while the second n-type transistor is used for the de-selected voltage.

Also, the gate biases of each of the unselected 1P2N decoders may not change during polarity transitions. For example, the 1P2N bi-polar decoders can have eight configuration modes: four positive configuration modes, where one positive configuration mode corresponds to a selection signal and three positive configuration modes correspond to de-selection signals; and four negative configuration modes, where one negative configuration mode corresponds to a selection signal and three negative configuration modes correspond to de-selection signals. For two of the unselected 1P2N bi-polar decoders (e.g., corresponding to the de-selection signals) the gate voltages do not change during polarity transitions, and for the third of the unselected 1P2N bi-polar decoders only one of the three gate voltages changes during polarity transitions.

As an example, a bias condition for the first transistor gate, the second transistor gate, and the third transistor gate for the decoder to provide a selection signal comprises zero volts for the first gate, the second gate, and the third gate for a positive memory cell configuration mode and a negative voltage for the third gate and zero volts for the first gate and the second gate for a negative memory cell configuration mode. A bias condition to provide a de-selection signal for the positive configuration mode comprises a positive voltage for the first gate, a negative voltage for the second gate, and a different positive for the third gate. The magnitude of the different positive voltage for the third gate is less than a magnitude of the positive voltage for the first gate while a magnitude of the different positive voltage for the third gate is less than a magnitude of the negative voltage. A bias condition to provide a de-selection signal for the negative configuration mode also comprises the positive voltage for the first gate, the negative voltage for the second gate, and the different positive for the third gate.

As an example for the 1P2N bi-polar decoders (which also have supply voltages provided thereto), a first positive configuration mode corresponding to a de-selection signal can have a first gate bias condition of 5.5 volts (V), a second gate bias condition of −3.4 V, and a third gate bias condition of 2.5 V, a second positive configuration mode corresponding to a de-selection signal can have a first gate bias condition of 0 V, a second gate bias condition of 0 V, and a third gate bias condition of 0 V, and a third positive configuration mode corresponding to a de-selection signal can have a first gate bias condition of 5.5 V, a second gate bias condition of −3.4 V, and a third gate bias condition of 2.5 V; and a first negative configuration mode corresponding to a de-selection signal can have a first gate bias condition of 5.5 V, a second gate bias condition of −3.4 V, and a third gate bias condition of 2.5 V, a second negative configuration mode corresponding to a de-selection signal can have a first gate bias condition of 0 V, a second gate bias condition of 0 V, and a third gate bias condition of −3.4 V, and a third negative configuration mode corresponding to a de-selection signal can have a first gate bias condition of 5.5 V, a second gate bias condition of −3.4 V, and a third gate bias condition of 2.5 V. For this example, only the third gate voltage selection signal is varied from the second positive configuration mode corresponding to a de-selection signal value of 0 V to the second negative configuration mode corresponding to a de-selection signal value of −3.4 V. In other words, for the first positive configuration mode and the first negative configuration mode the same first, second and third gate bias conditions (5.5 V, −3.4 V and 2.5 V, respectively) are utilized, for the third positive configuration mode and the third negative configuration mode the same first, second, and third gate bias conditions (5.5 V, −3.4 V and 2.5 V, respectively) are utilized, and for the second positive configuration mode and the second negative configuration mode the same first and second gate bias conditions (0 V and 0 V, respectively) are utilized. While particular bias condition values are discussed herein as examples, embodiments are not limited to these values. The pre-decoder circuitry disclosed herein can provide the first gate bias conditions, the second gate bias conditions, and the third gate bias conditions corresponding to the selection signals and de-selection signals.

For example, a first positive configuration or negative configuration pre-decoded address signal and a second positive configuration or negative configuration pre-decoded address signal can be provided to a NAND logic gate of the pre-decoder circuitry, and the first positive configuration or negative configuration pre-decoded address signal and the second positive configuration or negative configuration pre-decoded address signal can have a high voltage value or a low voltage value. A third positive configuration or negative configuration pre-decoded address signal and a fourth positive configuration or negative configuration pre-decoded address signal can be provided to a first NOR logic gate of the pre-decoder circuitry, and the third positive configuration or negative configuration pre-decoded address signal and the fourth positive configuration or negative configuration pre-decoded address signal can have a different high voltage value or a different low voltage value. The third positive configuration or negative configuration pre-decoded address signal and the fourth positive configuration or negative configuration pre-decoded address signal can also be provided to a second NOR logic gate of the pre-decoder circuitry.

The pre-decoder circuitry can include a NOT logic gate configured to receive an output of the first NOR logic gate. The NOT logic gate is configured to receive a pre-decoded zero voltage value for the positive configuration and a pre-decoded low voltage value for the negative configuration. Further, the magnitude of the pre-decoded high voltage value is greater than a magnitude of the pre-decoded low voltage value by at least a gate threshold voltage value and a magnitude of the different pre-decoded high voltage value is greater than a magnitude of the different pre-decoded low voltage value by at least the gate threshold voltage value.

In one example, the positive configuration de-selection bias condition for the first gate of the p-type transistor of the decoder circuitry can be provided when the first positive configuration pre-decoded address signal or the second positive configuration pre-decoded address signal has the low voltage value. The positive configuration de-selection bias condition for the second gate of the first n-type transistor of the decoder circuitry and the third gate of the second n-type transistor of the decoder circuitry can be provided when the third positive configuration pre-decoded address signal or the fourth positive configuration pre-decoded address signal have the different high voltage value.

Also, the negative configuration de-selection bias condition for the first gate of the p-type transistor of the decoder circuitry can be provided when the first negative configuration pre-decoded address signal or the second negative configuration pre-decoded address signal have the low voltage value. The negative configuration de-selection bias condition for the second gate of the first n-type transistor of the decoder circuitry and the third gate of the second n-type transistor of the decoder circuitry can be provided when the third negative configuration pre-decoded address signal or the fourth negative configuration pre-decoded address signal have the different high voltage value.

In another example, the positive configuration de-selection bias condition for the first gate of the p-type transistor of the decoder circuitry can be provided when both the first positive configuration pre-decoded address signal and the second positive configuration pre-decoded address signal have the low voltage value. Concurrently, the positive configuration de-selection bias condition for the second gate of the first n-type transistor of the decoder circuitry and the third gate of the second n-type transistor of the decoder circuitry can be provided when the third positive configuration pre-decoded address signal and the fourth positive configuration pre-decoded address signal have the different high voltage value.

Also, the negative configuration de-selection bias condition for the first gate of the p-type transistor of the decoder circuitry can be provided when the first negative configuration pre-decoded address signal and the second negative configuration pre-decoded address signal have the low voltage value. The negative configuration selection bias condition for the second gate of the first n-type transistor and the third gate of the second n-type transistor of the decoder circuitry can be provided when the first negative configuration pre-decoded address signal and the second negative configuration pre-decoded address signal have the different low voltage value. In a different example, the negative configuration selection bias condition for a first gate of a p-type transistor of decoder circuitry can be provided when the first negative configuration pre-decoded address signal and the second negative configuration pre-decoded address signal have the high voltage value.

In another example, the positive configuration selection bias condition for the first gate of the p-type transistor of the decoder circuitry can be provided when the first positive configuration pre-decoded address signal and the second positive configuration pre-decoded address signal have the high voltage value. Concurrently, the positive configuration selection bias condition for the second gate of the first n-type transistor of the decoder circuitry and the third gate of the second n-type transistor of the decoder circuitry can be provided when the third positive configuration pre-decoded address signal and the fourth positive configuration pre-decoded address signal have the different low voltage value.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge-Te, In-Se, Sb-Te, Ga-Sb, In-Sb, As-Te, Al-Te, Ge-Sb-Te, Te-Ge-As, In-Sb-Te, Te-Sn-Se, Ge-Se-Ga, Bi-Se-Sb, Ga-Se-Te, Sn-Sb-Te, In-Sb-Ge, Te-Ge-Sb-S, Te-Ge-Sn-O, Te-Ge-Sn-Au, Pd-Te-Ge-Sn, In-Se-Ti-Co, Ge-Sb-Te-Pd, Ge-Sb-Te-Co, Sb-Te-Bi-Se, Ag-In-Sb-Te, Ge-Sb-Se-Te, Ge-Sn-Sb-Te, Ge-Te-Sn-Ni, Ge-Te-Sn-Pd, or Ge-Te-Sn-Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge-Te may include $Ge_xTe_y$, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
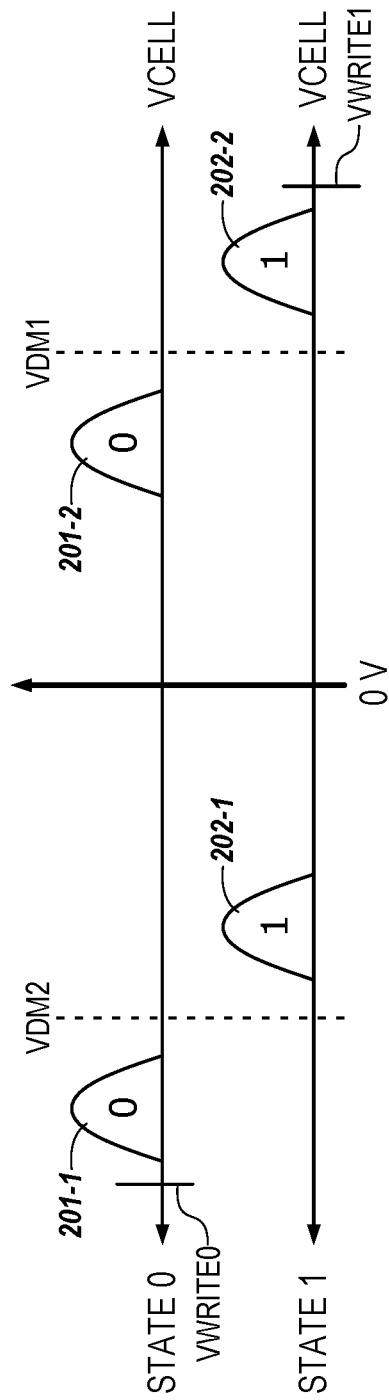
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of two possible data states (e.g., state 0 or state 1). That is, FIG. 2A illustrates threshold voltage distributions associated with two possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 201-1, 201-2, 202-1, and 202-2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
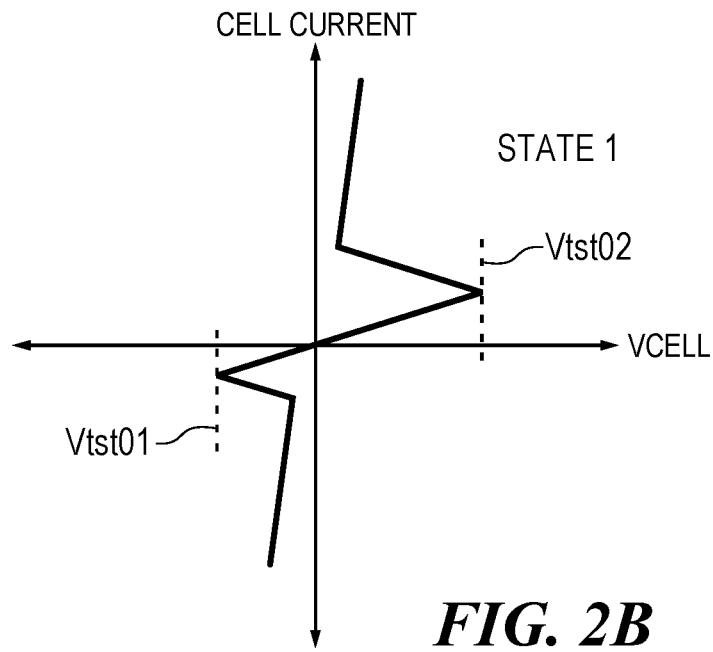
FIG. 2B is an example of a current-versus-voltage curve corresponding to a memory state of FIG. 2A, in accordance with an embodiment of the present disclosure.
Figure 2C:
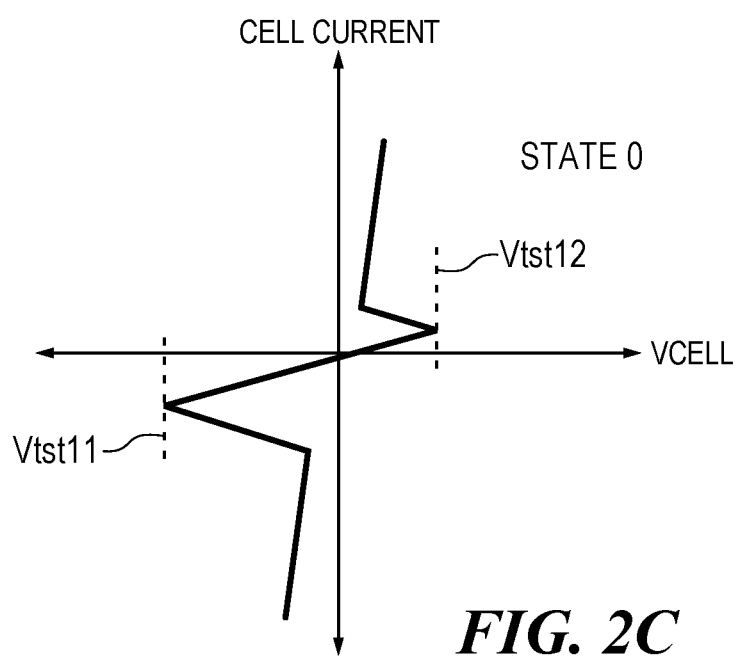
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to a reset state (e.g., state 0) or a set state (e.g., state 1) may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 202-1 and 202-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 202-2). Similarly, VDM2 is a negative voltage used to distinguish cells in state 1 (e.g., threshold voltage distribution 202-1) from cells in state 0 (e.g., threshold voltage distribution 201-1). In the examples of FIGS. 2A-2C, a memory cell 125 in a positive state 1 does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 202-1 and 202-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 202-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

Figure 3:
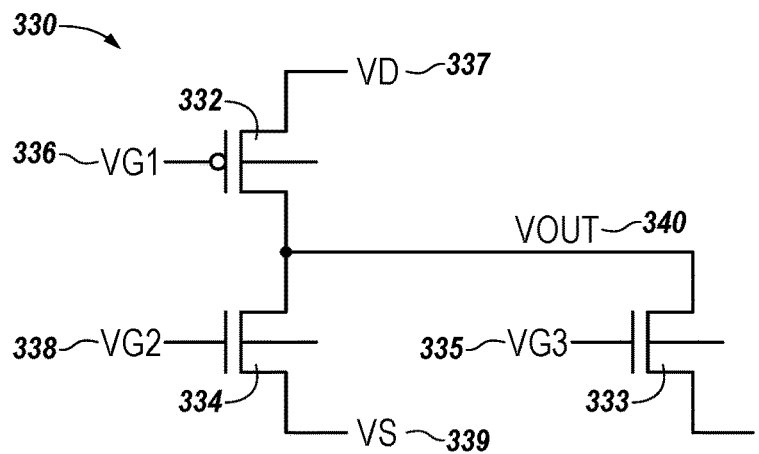
FIG. 3 illustrates decoder circuitry, in accordance with an embodiment of the present disclosure.

FIG. 3 illustrates decoder circuitry 330, in accordance with an embodiment of the present disclosure. As shown in FIG. 3, the decoder circuitry 330 can include a p-type transistor 332 and two-n-type transistors 333 and 334. The transistors may have a positive configuration and a negative configuration (e.g., can be bipolar).

The decoder circuitry 330 can include a p-type transistor 332 having a first gate, a first n-type transistor 334 having a second gate, and a second n-type transistor 333 having a third gate. Each of transistors 333 and 334 can include a respective n-type channel, and transistor 332 can include a p-type channel. While only a single set comprising one p-type transistor and two-n-type transistors is illustrated, various numbers of such transistor sets can be utilized. For instance, each respective word line and/or respective bit line of a memory array (e.g., memory array 100 described in connection with FIG. 1) may be coupled to a respective set of one p-type transistor and two-n-type transistors.

Memory devices, in accordance with embodiments of the present disclosure, can include memory cells that can be accessed by providing a voltage across the memory cell, where the data value stored by the cell is based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. One example of such a memory cell is a cross-point memory cell, as previously described herein (e.g., in connection with FIGS. 1 and 2A-2C).

For such memories, word lines and bit lines (word lines 110 and bit lines 120 previously described in connection with FIG. 1) can be used to provide selection signals and/or de-selection signals to respective memory cells. The selection signals may include signals characterized by voltage levels used for various operations (e.g., a write operation or a read operation) being performed on the memory cells. The word lines and bit lines may couple to selection and de-selection signal sources through decoding circuitry (e.g., decoder circuitry 330). That is, decoder circuitry 330 can be used to provide the selection and de-selection signals to the memory cells via the word lines and bit lines.

Decoder circuitry 330 can provide the selection and de-selection signals to the memory cells in response to bias conditions (e.g., a number of voltages) being provided to the decoder circuitry 330. For instance, bias conditions can be respectively provided to the first gate of the p-type transistor 332, the second gate of the first n-type transistor 334, and the third gate of the second n-type transistor 333 by pre-decoder circuitry, as will be discussed further herein. The bias condition provided to the first gate of the p-type transistor 332 can be a first voltage 336, which may be referred to as VG1. The bias condition provided to the second gate of the first n-type transistor 334 can be a second voltage 338, which may be referred to as VG2. The bias condition provided to the third gate of the second n-type transistor 333 can be a third voltage 335, which may be referred to as VG3. Embodiments provide that the first voltage (VG1) 336, the second voltage (VG2) 338, and the third voltage (VG3) 335 can be provided by the pre-decoder circuitry discussed further herein. In other words, the pre-decoder circuitry, discussed further herein, can be utilized to control the bias conditions provided to the decoder circuitry 330, which in turn controls the selection signals and/or de-selection signals provided to the memory cells.

Additionally, a number of other voltages (e.g., supply voltages) may be provided to the decoder circuitry 330. As shown in FIG. 3, a first supply voltage 337, which may be referred to as VD, may be provided to the first transistor 332. A second supply voltage 339, which may be referred to as VS, may be provided to the second transistor 334.

Decoder circuitry 330 can provide an output voltage 340, which may be referred to as VOUT. The output voltage 340 may be a voltage that is provided to a word line and/or a bit line (e.g., during a read or write operation). The output voltage 340 may be a selection signal (e.g. such that a memory cell is selected during an operation, such as a read operation or a write operation), or a de-selection signal (e.g., such that a memory cell is de-selected during an operation, such as a read operation or a write operation).

The decoder circuitry 330 can provide the output voltage 340 for a positive configuration (e.g., positive configuration selection signals and positive configuration de-selection signals) of the memory cells and for a negative configuration (e.g., negative configuration selection signals and negative configuration de-selection signals) of the memory cells. Various bias conditions (e.g., voltages) VG1 336, VG2 338, VG3 335, VD 337, and VS 339 may be utilized to provide the differing output voltages 340.

One or more embodiments provide that VG1 336 may be a positive voltage or zero volts. As an example, the VG1 positive voltage may have a value of 5.5 V. One or more embodiments provide that VG2 338 may be zero volts or a negative voltage. As an example, the VG2 negative voltage may have a value of −3.4 V.

One or more embodiments provide that VG3 335 may be a positive voltage, zero volts, or a negative voltage. The VG3 positive voltage and the VG3 negative voltage may have various values for differing applications. As an example, the VG3 positive voltage may have a value of 2.5 V and the VG3 negative voltage may have a value of −3.4 V. One or more embodiments provide that the VG3 positive voltage has a magnitude that is less than a magnitude of the VG1 positive voltage. One or more embodiments provide that the VG3 positive voltage has a magnitude that is less than a magnitude of the VG3 negative voltage. One or more embodiments provide that the VG3 negative voltage has a magnitude that is less than a magnitude of the VG1 positive voltage. One or more embodiments provide that the VG3 negative voltage has a magnitude that is equal to a magnitude of the VG2 negative voltage.

One or more embodiments provide that VD 337 may be a positive voltage or zero volts. As an example, the VD positive voltage may have a value of 3.4 V. One or more embodiments provide that the VD positive voltage has a magnitude that is less than a magnitude of the VG1 positive voltage and is greater than a magnitude of the VG3 positive voltage.

One or more embodiments provide that VS 339 may be zero volts or a negative voltage. As an example, the VS negative voltage may have a value of −3.4 V. One or more embodiments provide that the VS negative voltage has a magnitude that is equal to a magnitude of the VG2 negative voltage.

As mentioned, the decoder circuitry 330 can provide the output voltage 340 for a positive configuration (e.g., positive configuration selection signals and positive configuration de-selection signals) of the memory cells. Embodiments provide that the positive configuration can have four modes, where two modes provides a selection signal, and two modes provide de-selection signals.

To provide a positive configuration selection signal, the VG1 336 zero voltage may be utilized with the VG2 338 zero voltage and the VG3 335 zero voltage, where the VD 337 positive voltage is utilized, and the VS 339 is zero volts. Utilizing these voltage values can provide that the VD 337 positive voltage is provided as VOUT 340 (e.g., a positive configuration selection signal). As an example, if the VG1 336 is zero V, the VG2 338 is zero V, the VG3 335 is zero V, the VD 337 positive voltage is 3.4 V, and VS 337 is zero V, then the VOUT 340 will be 3.4 V.

To provide a first of the three positive configuration de-selection signals (e.g., a local de-selection signal), the VG1 336 positive voltage may be utilized with the VG2 338 negative voltage and the VG3 335 positive voltage, where the VD 337 positive voltage is utilized, and the VS 339 is zero volts. Utilizing these voltage values can provide that zero volts is provided as VOUT 340 (e.g., a positive configuration de-selection signal). As an example, if the VG1 336 positive voltage is 5.5 V, the VG2 338 negative voltage is −3.4 V, the VG3 335 positive voltage is 2.5 V, the VD 337 positive voltage is 3.4 V, and VS 339 is zero V, then the VOUT 340 will be zero V.

To provide a second of three positive configuration de-selection signals (e.g., a global de-selection signal), the VG1 336 zero voltage may be utilized with the VG2 338 zero voltage and the VG3 335 zero voltage, where the VD 337 is zero volts, and the VS 339 is zero volts. Utilizing these voltage values can provide that VOUT 340 is floated (e.g., a positive configuration de-selection signal).

To provide a third of three positive configuration de-selection signals (e.g., a global and local de-selection signal), the VG1 336 positive voltage may be utilized with the VG2 338 negative voltage and the VG3 335 positive voltage, where the VD 337 is zero volts, and the VS 339 is zero volts. Utilizing these voltage values can provide that zero volts is provided as VOUT 340 (e.g., a positive configuration de-selection signal). As an example, if the VG1 336 positive voltage is 5.5 V, the VG2 338 negative voltage is −3.4 V, the VG3 335 positive voltage is 2.5 V, the VD 337 is zero V, and VS 339 is zero V, then the VOUT 340 will be zero V.

As mentioned, the decoder circuitry 330 can provide the output voltage 340 for a negative configuration (e.g., negative configuration selection signals and negative configuration de-selection signals) of the memory cells. Embodiments provide that the negative configuration can have four modes, where one mode provides a selection signal, and three modes provide de-selection signals.

To provide a negative configuration selection signal, the VG1 336 is zero volts, the VG2 is zero volts and the VG3 335 negative voltage, where the VD 337 is zero volts, and the VS 339 utilizes negative voltage. Utilizing these voltage values can provide that the VS 339 negative voltage is provided as VOUT 340 (e.g., the negative configuration selection signal). As an example, if the VG1 336 is zero V, the VG2 338 is zero volts, the VG3 335 negative voltage is −3.4 V, the VD 337 is zero V, and VS 339 is −3.4 V, then the VOUT 340 will be −3.4 V.

To provide a first of the three negative configuration de-selection signals (e.g., a local de-selection signal), the VG1 336 positive voltage may be utilized with the VG2 338 negative voltage and the VG3 335 positive voltage, where the VD 337 is zero volts, and the VS 339 utilizes negative voltage. Utilizing these voltage values can provide that the VOUT 340 is zero V (e.g., a negative configuration de-selection signal). As an example, if the VG1 336 positive voltage is 5.5 V, the VG2 338 negative voltage is −3.4 V, the VG3 335 positive voltage is 2.5 V, the VD 337 is zero V, and VS 339 negative voltage is −3.4 V, then the VOUT 340 will be zero V.

To provide a second of the three negative configuration de-selection signals (e.g., a global de-selection signal), the VG1 336 zero voltage may be utilized with the VG2 338 zero voltage and the VG3 335 negative voltage, where the VD 337 is zero volts, and the VS 339 is zero volts. Utilizing these voltage values can provide that VOUT 340 is floated (e.g., a negative configuration de-selection signal). As an example, if the VG1 336 is zero V, the VG2 338 is zero V, the VG3 335 negative voltage is −3.4 V, the VD 337 is zero V, and VS 337 is zero V, then the VOUT 340 will be floated.

To provide a third of the three negative configuration de-selection signals (e.g., a global and local de-selection signal), the VG1 336 positive voltage may be utilized with the VG2 338 negative voltage and the VG3 335 positive voltage, where the VD 337 is zero volts, and the VS 339 is zero volts. Utilizing these voltage values can provide that zero volts is provided as VOUT 340 (e.g., a negative configuration de-selection signal). As an example, if the VG1 336 positive voltage is 5.5 V, the VG2 338 negative voltage is −3.4 V, the VG3 335 positive voltage is 2.5 V, the VD 337 is zero V, and VS 339 is zero V, then the VOUT 340 will be zero V.

Figure 4:
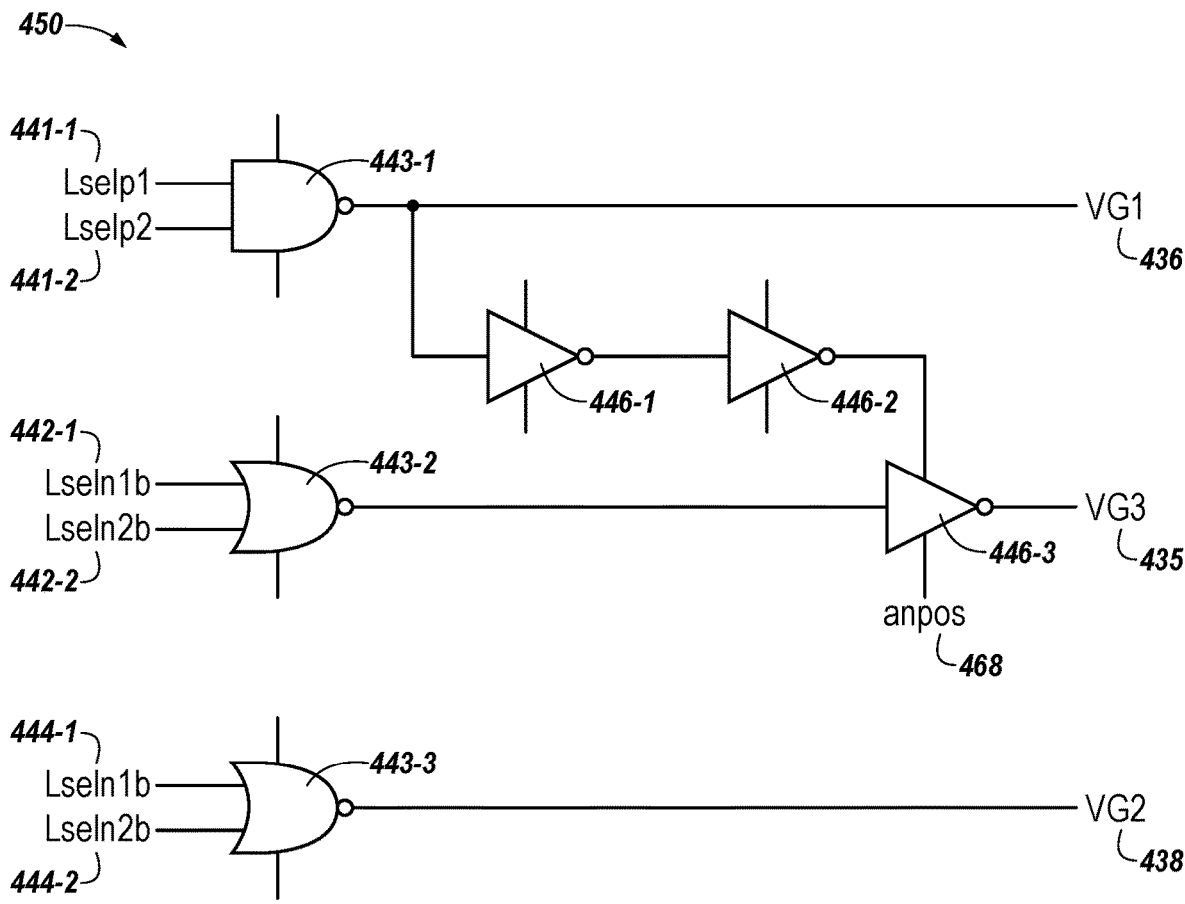
FIG. 4 illustrates pre-decoder circuitry, in accordance with an embodiment of the present disclosure.

FIG. 4 illustrates pre-decoder circuitry 450, in accordance with an embodiment of the present disclosure. As mentioned, the pre-decoder circuitry 450 can provide a bias condition for the first gate of the p-type transistor, the second gate of the first n-type transistor, and the third gate of the second n-type transistor of decoder circuitry 330, shown in FIG. 3. As shown in FIG. 4, the pre-decoder circuitry 450 can include a NAND logic gate 443-1, a first NOR logic gate 443-2, and a second NOR logic gate 443-3.

The NAND logic gate 443-1 is configured to receive a first pre-decoded address signal (Lselp1) 441-1 and a second pre-decoded address signal (Lselp2) 441-2. The first pre-decoded address signal 441-1 can have a positive configuration or a negative configuration. The second pre-decoded address signal 441-2 can have a positive configuration or a negative configuration. The NAND logic gate 443-1 is configured to receive a first pre-decoded address signal 444-1 having a pre-decoded high voltage value relative to a pre-decoded low voltage value and a second pre-decoded address signal 444-2 having the pre-decoded high voltage value. In one embodiment, the first pre-decoded address signal 441-1 and the second pre-decoded address signal 441-2 have the pre-decoded low voltage value. For example, the first pre-decoded address signal 441-1 and the second pre-decoded address signal 441-2 be 5.5 V, or zero volts. A NOT logic gate 446-1 can receive an output of the NAND logic gate 443-2. Another logic gate 446-2 can receive an output of the NOT logic gate 446-2.

The first NOR logic gate 443-2 is configured to receive a third pre-decoded address signal (Lseln1*b*) 442-1 and a fourth pre-decoded address signal (Lseln2*b*) 442-2. The third pre-decoded address signal 442-1 can have a positive configuration or a negative configuration. The fourth pre-decoded address signal 442-2 can have a positive configuration or a negative configuration. In one example, the first NOR logic gate 443-2 is configured to receive a third pre-decoded address signal 442-1 having a different pre-decoded high voltage value relative to a different pre-decoded low voltage value and a fourth pre-decoded address signal 442-2 having the different pre-decoded high voltage value. In one embodiment, the third pre-decoded address signal 442-1 and a fourth positive configuration pre-decoded address signal 442-2 can have the different pre-decoded low voltage value. For example, the third pre-decoded address signal 442-1 and the fourth pre-decoded address signal 442-2 be 1.2 V, or −3.4 V.

The second NOR logic gate 443-3 is configured to receive the third pre-decoded address signal (Lseln1*b*) 444-1 and the fourth pre-decoded address signal (Lseln2*b*) 444-2. The third pre-decoded address signal 444-1 can have a positive configuration or a negative configuration. The fourth pre-decoded address signal 444-2 can have a positive configuration or a negative configuration. The third pre-decoded address signal 444-1 and the fourth pre-decoded address signal 444-2 can have the different pre-decoded low voltage value, or the different pre-decoded high voltage value.

The pre-decoder circuitry includes a NOT logic gate 446-3 configured to receive an output of the first NOR logic gate 443-2. In some embodiments, the NOT logic gate 446-3 is configured to receive a pre-decoded zero voltage value for a positive configuration. In other embodiments, the NOT logic gate 446-3 is configured to receive a pre-decoded low voltage value (e.g. −3.4 V) for a negative configuration.

The pre-decoder circuitry 450 can provide the bias conditions (e.g., VG1, VG2, VG3) for positive configuration selection signals and positive configuration de-selection signals, and can provide the bias conditions (e.g., VG1, VG2, VG3) for negative configuration selection signals and negative configuration de-selection signals. Embodiments provide that the positive configuration can have two modes, where one mode provides bias conditions (e.g., VG1, VG2, VG3) for a selection signal, and one mode provides bias conditions (e.g., VG1, VG2, VG3) for a de-selection signal. Embodiments further provide that the negative configuration can have two modes, where one mode provides bias conditions (e.g., VG1, VG2, VG3) for a selection signal, and one mode provides bias conditions (e.g., VG1, VG2, VG3) for a de-selection signal.

For the positive configuration providing bias conditions (e.g., VG1, VG2, VG3) for a selection signal, the pre-decoded address signals 441-1 (Lselp1) and 441-2 (Lselp1) can be provided to NAND logic gate 443-1. As used herein a "pre-decoded address signal" refers to a signal provided from other circuitry to the pre-decoder circuitry 450. The first pre-decoded address signal 441-1 can have a high voltage value, as compared to pre-decoded address signals having a relatively lower voltage value, and the second pre-decoded address signal 441-2 can have the high voltage value. As an example, the pre-decoded address signals 441-1 and 444-2 can have a high voltage value of 5.5 V.

Additionally, for the positive configuration providing bias conditions (e.g., VG1, VG2, VG3) for the selection signal, pre-decoded address signals 442-1 (Lseln1*b*) and 442-2 (Lseln2*b*) can be provided to the first NOR logic gate 443-2. The third pre-decoded address signal 442-1 and the fourth pre-decoded address signal 442-2 can have a different low voltage value, as compared to pre-decoded address signals having a different high voltage value. As an example, the pre-decoded address signals 442-1 and 442-2 can have a different low voltage value of −3.4 V.

Additionally, for the positive configuration providing bias conditions (e.g., VG1, VG2, VG3) for the selection signal, pre-decoded address signals 444-1 (Lseln1*b*) and 444-2 (Lseln2*b*) can be provided to the second NOR logic date 443-3. The third pre-decoded address signal 443-1 and the fourth pre-decoded address signal 444-2 can have the different low voltage value. As an example, the pre-decoded address signal 444-1 and the pre-decoded address signal 444-2 can have the different low voltage value of −3.4 V. Additionally, for the positive configuration providing bias conditions (e.g., VG1, VG2, VG3) for the selection signal, an enable signal 468 (anpos) can be provided to NOT logic gate 446-3. The enable signal 468 can have a zero voltage value.

For the positive configuration providing bias conditions (e.g., VG1, VG2, VG3) for the selection signal, VG1 436, VG2 438, and VG3 435 can all have a zero voltage value. For the positive configuration providing bias conditions (e.g., VG1, VG2, VG3) for a de-selection signal, the pre-decoded address signals 441-1 (Lselp1) and 441-2 (Lselp1) can be provided to NAND logic gate 443-1. The first pre-decoded address signal 441-1 and/or the second pre-decoded address signal 444-2 can have a low voltage value, as compared to pre-decoded address signals having a relatively higher voltage value.

In one example, the first positive configuration pre-decoded address signal 441-1 or the second positive configuration pre-decoded address signal 441-2 can have the low voltage value. In another example, both the first positive configuration pre-decoded address signal 441-1 and the second positive configuration pre-decoded address signal 441-2 can have the low voltage value. Various high voltage values and low voltage values can be utilized for different applications. As an example, the high voltage value can be 5.5 V while the low voltage value can be 0 V.

Additionally, for the positive configuration providing bias conditions (e.g., VG1, VG2) for the de-selection signal, the pre-decoded address signals 442-1 (Lseln1*b*) and 442-2 (Lseln2*b*) can be provided to the first NOR logic gate 443-2. The third pre-decoded address signal 442-1 and/or the fourth pre-decoded address signal 442-2 can have a different high voltage value, as compared to pre-decoded address signals having a different lower voltage value.

In one example, the third positive configuration pre-decoded address signal 442-1 or the fourth positive configuration pre-decoded address signal 442-2 can have the different high voltage value. In another example, both the third positive configuration pre-decoded address signal 442-1 and the fourth positive configuration pre-decoded address signal 442-2 can have the different high voltage value. Various different high voltage values and different low voltage values can be utilized for different applications. As an example, the different high voltage value can be 1.2 V while the different low voltage value can be −3.4 V.

Additionally, for the positive configuration providing bias conditions (e.g., VG1, VG2) for the de-selection signal, the pre-decoded address signals 444-1 (Lseln1b) and 444-2 (Lseln2b) can be provided to the second NOR logic gate 443-3. The third pre-decoded address signal 444-1 and/or the fourth pre-decoded address signal 444-2 can have the different high voltage value.

Additionally, for the positive configuration providing bias conditions (e.g., VG1, VG2, VG3) for the de-selection signal, an enable signal 468 (anpos) can be provided to NOT logic gate 446-3. The enable signal 468 can have a zero voltage value.

For the positive configuration providing bias conditions (e.g., VG1, VG2, VG3) for the de-selection signal, VG1 436, VG2 438, and VG3 435 may have different voltage values. For example, VG1 436 may have the high voltage value, VG3 435 may have a different high voltage value and VG2 438 may have a different low voltage value. Various low voltage values can be utilized for different applications. As an example, VG1 436 can have a high voltage value of 5.5 V, VG3 435 may have a different high voltage value of 2.5 V, and VG2 438 can have a different low voltage value of −3.4 V.

For the negative configuration providing bias conditions (e.g., VG1, VG2, VG3) for a selection signal, pre-decoded address signals 441-1 (Lselp1) and 441-2 (Lselp1) can be provided to NAND logic gate 443-1. A first pre-decoded address signal 441-1 and second pre-decoded address signal 441-2 can have a high voltage value, as compared to pre-decoded address signals having a relatively lower voltage value. As an example, the pre-decoded address signals 441-1 and 444-2 can have a high voltage value of 5.5 V, as compared to a low voltage value of 0 V.

For the negative configuration providing bias conditions (e.g., VG1, VG2, VG3) for a selection signal, pre-decoded address signals 442-1 (Lseln1b) and 442-2 (Lseln2b) can be provided to the first NOR logic gate 443-2. The third pre-decoded address signal 442-1 and the fourth pre-decoded address signal 442-2 can have a different low voltage value, as compared to pre-decoded address signals having a relatively higher different voltage value. As an example, the pre-decoded address signals 442-1 and 442-2 can have a different low voltage value of −3.4 V, as compared to a different high voltage value of 1.2V.

For the negative configuration providing bias conditions (e.g., VG1, VG2, VG3) for a selection signal, pre-decoded address signals 444-1 (Lseln1b) and 444-2 (Lseln2b) can be provided to the second NOR logic gate 443-3. The third pre-decoded address signal 443-1 and the fourth pre-decoded address signal 444-2 can have the different low voltage value. As an example, the pre-decoded address signal 444-1 and the pre-decoded address signal 444-2 can have the different low voltage value of −3.4 V.

For the negative configuration providing bias conditions (e.g., VG1, VG2, VG3) for the selection signal, an enable signal 468 (anpos) can be provided to NOT logic gate 446-3. The enable signal 468 can have the different low voltage value. Various enable signal low voltage values can be utilized for different applications. As an example, the enable signal 468 can have a low voltage value of −3.4 V. For the negative configuration providing bias conditions (e.g., VG1, VG2, VG3) for the selection signal, VG1 436 and VG2 438 can have a zero voltage and VG3 435 can all have the different low voltage value (e.g., −3.4 V).

For the negative configuration providing bias conditions (e.g., VG1, VG2, VG3) for a de-selection signal, the pre-decoded address signals 441-1 (Lselp1) and 441-2 (Lselp1) can be provided to NAND logic gate 443-1. The first pre-decoded address signal 441-1 and/or the second pre-decoded address signal 441-2 can have a low voltage value, as compared to pre-decoded address signals having a relatively higher voltage value.

In one example, the first negative configuration pre-decoded address signal 441-1 or the second negative configuration pre-decoded address signal 441-2 can have the low voltage value. In another example, both the first negative configuration pre-decoded address signal 441-1 and the second negative configuration pre-decoded address signal 441-2 can have the low voltage value. Various high voltage values and low voltage values can be utilized for different applications. As an example, the high voltage value can be 5.5 V while the low voltage value can be 0 V.

Additionally, for the negative configuration providing bias conditions (e.g., VG1, VG2, VG3) for a de-selection signal, the pre-decoded address signals 442-1 (Lseln1b) and 442-2 (Lseln2b) can be provided to the first NOR logic gate 443-2. The third pre-decoded address signal 442-1 and/or the fourth pre-decoded address signal 442-2 can have a different high voltage value, as compared to pre-decoded address signals having a different relatively lower voltage value.

In one example, the third negative configuration pre-decoded address signal 442-1 or the fourth negative configuration pre-decoded address signal 442-2 can have the different high voltage value. In another example, both the third negative configuration pre-decoded address signal 442-1 and the fourth negative configuration pre-decoded address signal 442-2 can have the different high voltage value. Various different high voltage values and different low voltage values can be utilized for different applications. As an example, the different high voltage value can be 1.2 V while the different low voltage value can be −3.4 V.

Additionally, for the negative configuration providing bias conditions (e.g., VG1, VG2, VG3) for a de-selection signal, the pre-decoded address signals 444-1 (Lseln1b) and 444-2 (Lseln2b) can be provided to the second NOR logic gate 443-3. The third pre-decoded address signal 443-1 and/or the fourth pre-decoded address signal 444-2 can have the different high voltage value. As an example, the pre-decoded address signal 444-1 and/or the pre-decoded address signal 444-2 can have the different high voltage value of 1.2 V.

For the negative configuration providing bias conditions (e.g., VG1, VG2, VG3) for the selection signal, an enable signal 468 (anpos) can be provided to NOT logic gate 446-3. The enable signal 468 can have the different low voltage value. Various enable signal low voltage values can be utilized for different applications. As an example, the enable signal 468 can have a low voltage value of −3.4 V.

For the negative configuration providing bias conditions (e.g., VG1, VG2, VG3) for the de-selection signal, VG1 436, VG2 438, and VG3 435 may have different voltage values. For example, VG1 436 may have the high voltage value, VG3 435 may have a different high voltage value and VG2 438 may have a different low voltage value. Various low voltage values can be utilized for different applications. As an example, VG1 4361 can have a high voltage value of 5.5 V, VG 3 435 may have a different high voltage value of 2.5 V, and VG2 438 can have a different low voltage value of −3.4 V.

Figure 5:
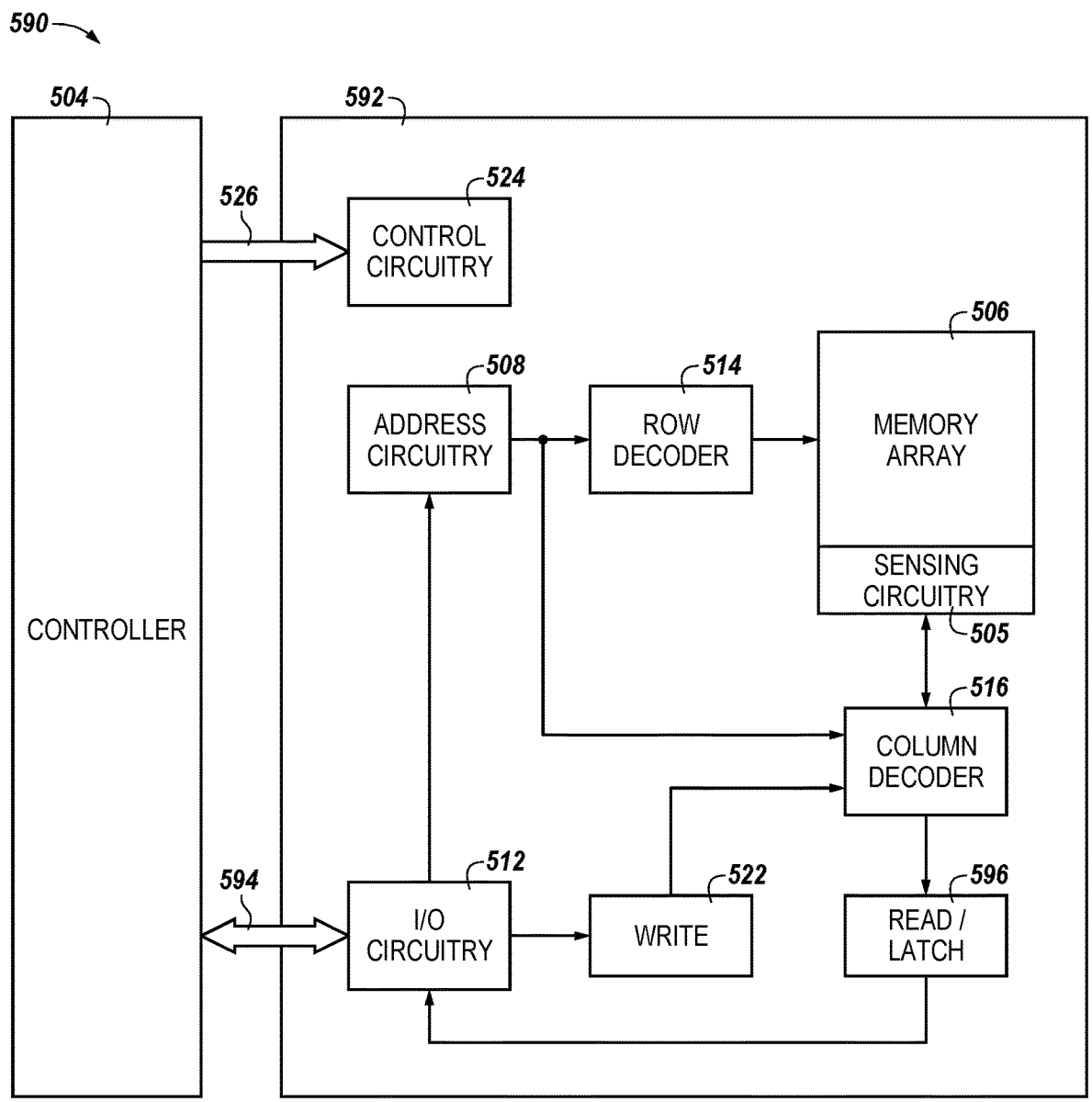
FIG. 5 is a block diagram illustration of an example apparatus, in accordance with an embodiment of the present disclosure.

FIG. 5 is a block diagram illustration of an example apparatus, such as an electronic memory system 590, in accordance with an embodiment of the present disclosure. Memory system 590 may include an apparatus, such as a memory device 592 and a controller 504, such as a memory controller (e.g., a host controller). Controller 504 might include a processor, for example. Controller 504 might be coupled to a host, for example, and may receive command signals (or commands), address signals (or addresses), and data signals (or data) from the host and may output data to the host.

Memory device 592 includes a memory array 506 of memory cells. For example, memory array 506 may include one or more of the memory arrays, such as a cross-point array, of memory cells disclosed herein. Memory device 592 may include address circuitry 508 to latch address signals provided over I/O connections 594 through I/O circuitry 512. Address signals may be received and decoded by a row decoder 514 and a column decoder 516 to access the memory array 506. For example, row decoder 514 and/or column decoder 516 may include drivers, and may include decoder circuitry 330 and pre-decoder circuitry 450 previously described in connection with FIGS. 3 and 4, respectively.

Memory device 592 may sense (e.g., read) data in memory array 506 by sensing voltage and/or current changes in the memory array columns using sense/buffer circuitry that in some examples may be read/latch circuitry 596. Read/latch circuitry 596 may read and latch data from the memory array 506. Sensing circuitry 505 may include a number of sense amplifiers coupled to memory cells of memory array 506, which may operate in combination with the read/latch circuitry 596 to sense (e.g., read) memory states from targeted memory cells. I/O circuitry 512 may be included for bi-directional data communication over the I/O connections 594 with controller 504. Write circuitry 522 may be included to write data to memory array 506.

Control circuitry 524 may decode signals provided by control connections 526 from controller 504. These signals may include chip signals, write enable signals, and address latch signals that are used to control the operations on memory array 506, including data read and data write operations.

Control circuitry 524 may be included in controller 504, for example. Controller 504 may include other circuitry, firmware, software, or the like, whether alone or in combination. Controller 504 may be an external controller (e.g., in a separate die from the memory array 506, whether wholly or in part) or an internal controller (e.g., included in a same die as the memory array 506). For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. he scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory array including a plurality of memory cells;
decoder circuitry coupled to the memory array, wherein the decoder circuitry comprises a p-type transistor having a first gate, a first n-type transistor having a second gate, and a second n-type transistor having a third gate; and
pre-decoder circuitry configured to provide a bias condition for the first gate, the second gate, and the third gate to provide a de-selection signal to one of the plurality of memory cells, wherein the bias condition comprises:
a positive voltage for the first gate;
a negative voltage for the second gate; and
a different positive voltage for the third gate.

2. The apparatus of claim 1, wherein the de-selection signal is provided to the one of the plurality of memory cells for a positive configuration for the memory cells.

3. The apparatus of claim 2, wherein the pre-decoder circuitry is configured to provide an additional bias condition for the first gate, the second gate, and the third gate to provide a selection signal to the one of the plurality of memory cells for the positive configuration for the memory cells, wherein the additional bias condition comprises:
zero volts for the first gate;
zero volts for the second gate; and
zero volts for the third gate.

4. The apparatus of claim 1, wherein the de-selection signal is provided to the one of the plurality of memory cells for a negative configuration for the memory cells.

5. The apparatus of claim 4, wherein the pre-decoder circuitry is configured to provide an additional bias condition for the first gate, the second gate, and the third gate to provide a selection signal to the one of the plurality of memory cells for the negative configuration for the memory cells, wherein the additional bias condition comprises:
zero volts for the first gate;
zero volts for the second gate; and
a negative voltage for the third gate.

6. The apparatus of claim 1, wherein a magnitude of the different positive voltage for the third gate is less than a magnitude of the positive voltage for the first gate and a magnitude of the negative voltage.

7. The apparatus of claim 1, wherein the pre-decoder circuitry includes:
a NAND logic gate;
a first NOR logic gate; and
a second NOR logic gate.

8. The apparatus of claim 7, wherein the NAND logic gate is configured to receive a first pre-decoded address signal having a pre-decoded low voltage value relative to a pre-decoded high voltage value and a second pre-decoded address signal having the pre-decoded low voltage value.

9. The apparatus of claim 7, wherein the first NOR logic gate and the second NOR logic gate are configured to receive a first pre-decoded address signal having a pre-decoded high voltage value relative to a pre-decoded low voltage value and a second pre-decoded address signal having the pre-decoded high voltage value.

10. A method of operating memory, comprising:
providing a first positive configuration pre-decoded address signal and a second positive configuration pre-decoded address signal to a NAND logic gate of pre-decoder circuitry, wherein the first positive configuration pre-decoded address signal and the second positive configuration pre-decoded address signal have a high voltage value or a low voltage value; and
providing a positive configuration de-selection bias condition for a gate of a p-type transistor of decoder circuitry when the first positive configuration pre-decoded address signal or the second positive configuration pre-decoded address signal has the low voltage value.

11. The method of claim 10, wherein the method includes providing the positive configuration de-selection bias condition for the gate of the p-type transistor of the decoder circuitry when the first positive configuration pre-decoded address signal and the second positive configuration pre-decoded address signal have the low voltage value.

12. The method of claim 10, wherein the method includes:
providing a third positive configuration pre-decoded address signal and a fourth positive configuration pre-decoded address signal to a NOR logic gate of the pre-decoder circuitry, wherein the third positive configuration pre-decoded address signal and the fourth positive configuration pre-decoded address signal have a different high voltage value or a different low voltage value; and
providing a positive configuration de-selection bias condition for a gate of a first n-type transistor of the decoder circuitry and a gate of a second n-type transistor of the decoder circuitry when the third positive configuration pre-decoded address signal or the fourth positive configuration pre-decoded address signal have the different high voltage value.

13. The method of claim 12, wherein the method includes providing the positive configuration de-selection bias condition for the gate of the first n-type transistor of the decoder circuitry and the gate of the second n-type transistor of the decoder circuitry when the third positive configuration pre-decoded address signal and the fourth positive configuration pre-decoded address signal have the different high voltage value.

14. The method of claim 12, wherein the method includes providing the third positive configuration pre-decoded address signal and the fourth positive configuration pre-decoded address signal to an additional NOR logic gate of the pre-decoder circuitry.

15. The method of claim 10, wherein a magnitude of the high voltage value is greater than a magnitude of the low voltage value by at least a gate threshold voltage value.

16. A method of operating memory, comprising:
providing a first negative configuration pre-decoded address signal and a second negative configuration pre-decoded address signal to a NAND logic gate of pre-decoder circuitry, wherein the first negative configuration pre-decoded address signal and the second negative configuration pre-decoded address signal have a high voltage value or a low voltage value; and
providing a negative configuration de-selection bias condition for a gate of a p-type transistor of decoder circuitry when the first negative configuration pre-decoded address signal or the second negative configuration pre-decoded address signal has the low voltage value.

17. The method of claim 16, wherein the method includes providing the negative configuration de-selection bias condition for the gate of the p-type transistor of the decoder circuitry when the first negative configuration pre-decoded address signal and the second negative configuration pre-decoded address signal have the low voltage value.

18. The method of claim 16, wherein the method includes:
providing a third negative configuration pre-decoded address signal and a fourth negative configuration pre-decoded address signal to a NOR logic gate of the pre-decoder circuitry, wherein the third negative configuration pre-decoded address signal and the fourth negative configuration pre-decoded address signal have a different high voltage value or a different low voltage value; and
providing a negative configuration de-selection bias condition for a gate of a first n-type transistor of the decoder circuitry and a gate of a second n-type transistor of the decoder circuitry when the third negative configuration pre-decoded address signal or the fourth negative configuration pre-decoded address signal have the different high voltage value.

19. The method of claim 18, wherein the method includes providing the third negative configuration pre-decoded address signal and the fourth negative configuration pre-decoded address signal to an additional NOR logic gate of the pre-decoder circuitry.

20. The method of claim 18, wherein a magnitude of the different high voltage value is greater than a magnitude of the different low voltage value by at least a gate threshold voltage value.

* * * * *